United States Patent
Raichman et al.

(10) Patent No.: US 7,151,389 B2
(45) Date of Patent: Dec. 19, 2006

(54) DUAL CHANNEL SOURCE MEASUREMENT UNIT FOR SEMICONDUCTOR DEVICE TESTING

(75) Inventors: Tal Raichman, San Francisco, CA (US); Peter P. Cuevas, Los Gatos, CA (US); James Borthwick, Sunnyvale, CA (US); Michael A. Casolo, Oakland, CA (US)

(73) Assignee: Qualitau, Inc., Santa Clara, CA (US)

( * ) Notice: Subject to any disclaimer, the term of this patent is extended or adjusted under 35 U.S.C. 154(b) by 0 days.

(21) Appl. No.: 11/071,339

(22) Filed: Mar. 2, 2005

(65) Prior Publication Data

US 2005/0194963 A1    Sep. 8, 2005

Related U.S. Application Data

(60) Provisional application No. 60/550,380, filed on Mar. 5, 2004.

(51) Int. Cl.
*G01R 31/26* (2006.01)
(52) U.S. Cl. .................. 324/765; 324/73.1; 324/158.1
(58) Field of Classification Search ............... None
See application file for complete search history.

(56) References Cited

U.S. PATENT DOCUMENTS 5,225,775 A * 7/1993 Sekino ................. 324/158.1
5,386,189 A * 1/1995 Nishimura et al. ...... 324/158.1
5,794,175 A * 8/1998 Conner ...................... 702/119
5,880,540 A * 3/1999 Bessho et al. ............. 307/131
6,020,752 A * 2/2000 Shimasaki .................. 324/765
6,943,576 B1 * 9/2005 Byun et al. ................. 324/765
6,954,079 B1 * 10/2005 Sugimoto et al. ........... 324/763

OTHER PUBLICATIONS

International Search Report and Written Opinion in corresponding application PCT/US05/06951, mailed Apr. 17, 2006.

* cited by examiner

*Primary Examiner*—Minh N. Tang
(74) *Attorney, Agent, or Firm*—Beyer Weaver & Thomas LLP

(57) ABSTRACT

A dual channel source measurement unit for reliability testing of electrical devices provides a voltage stress stimulus to a device under test and monitors degradation to the device under test caused by the stress simulator. The dual channel source measurement unit decouples the stress and monitor portions of the unit so that the requirements of each can be optimized. Deglitching and current clamp switches can be incorporated in the dual channel source measurement unit to prevent glitches in the switching circuitry and to limit or clamp current flow to or from the monitor and stress sources.

8 Claims, 2 Drawing Sheets

DUAL CHANNEL SOURCE MEASUREMENT UNIT FOR SEMICONDUCTOR DEVICE TESTING

CROSS REFERENCE TO RELATED APPLICATIONS

This application claims priority to U.S. Provisional Patent Application No. 60/550,380, filed Mar. 5, 2004, which is incorporated herein for all purposes.

BACKGROUND OF THE INVENTION

This invention relates generally to semiconductor device testing, and more particularly the invention relates to a dual channel source measurement unit (SMU) for testing semiconductor device reliability.

A SMU as used for semiconductor reliability testing provides a voltage stress stimulus to a device under test (DUT) and monitors degradation to the DUT caused by the stress stimulus. FIG. 1 is a block diagram of a SMU which includes a digital to analog converter (DAC) 10, gain or amplification block 12, and a resistor network or RNET 14 for measuring current flow to or from the DUT 16 through switch 17. The voltage source DAC 10 and gain unit 12 provide the stress stimulus to DUT 16, while RNET 14 provides monitoring capabilities.

A semiconductor reliability test typically requires the capability to perform the stress and monitor procedures on more than one DUT. This is necessary because calculating reliability information requires statistical analysis with sample sizes large enough that valid conclusions can be drawn. The most practical method of testing many DUTs at one time is to have a multiple output SMU. For example, a single SMU with n outputs can be used instead of n single output SMUs thus decreasing required equipment and cost. It is possible to replace the single output SMUs with one multiple output SMU because some of the required resources on the SMU can be shared among the DUTs. A SMU that fulfills the requirement of multiple outputs is shown in FIG. 2 which includes a DAC 10, gain unit 12, and a plurality of buffers 18 and toggle switches 20, 22 which connect buffers 18 to DUTs 16 and RNET 14 to individual buffers and DUTs.

In this Single Channel Multiple Output SMU configuration the output of the programmable voltage source is connected to buffered sources, which "follow" the output and provide the required voltage to each DUT. The RNET is used to measure current and can be connected to any of the buffered sources to perform measurements on the connected DUTs. This configuration allows resources such as the programmable voltage source and the RNET to be shared among the DUTs.

While the Single Channel Multiple Output SMU configuration does allow multiple DUTs to be tested using a single SMU, it has limitations that impose penalties on certain types of testing. One of the main limitations is the requirement of all connected DUTs to have the same voltage potential applied. This limitation is imposed by having a single programmable voltage source, which all the buffered sources follow. Practically, this means that all the DUTs connected to a SMU must be in their stress or monitor phase at the same time. It would therefore take n times the single DUT measurement time where n is the number of DUTs being tested. Another limitation is that the output power available to each DUT is restricted to that of the buffered sources. Practically, this means the stress and monitor phase of a test are limited to the same power conditions. Finally, in order to make low current measurements (<1 nA) this SMU configuration requires the use of low current leakage buffers which have limitations that would not be present if buffer current leakage was not a factor.

The present invention overcomes these limitations.

SUMMARY OF THE INVENTION

A dual channel source measurement unit (SMU) in accordance with the invention decouples the stress and monitor portions of a SMU so that the requirements of each can be optimized. Thus, the SMU now has the capability of sourcing a different voltage to one DUT while other DUTs are at another voltage condition. This is needed in tests where the amount of time between stress and monitor phases must be kept to a minimum.

The invention and objects and features thereof will be more readily apparent from the following detailed description and appended claims when taken with the drawings.

DETAILED DESCRIPTION OF THE ILLUSTRATED EMBODIMENTS

As noted above, the source measurement unit has two programmable voltage sources which are referred to as the stress source and the monitor source. While the stress source has no other function than outputting a set voltage, the monitor voltage and its connected circuitry provide several other capabilities including measuring current flowing through the source, source and current while measuring the output voltage at the source, and the capability to limit either voltage or current to a programmed compliance level. Along with the stress and monitor sources, the SMU has several voltage following buffers each of which can be connected to the device under test (DUT). The buffers are configured so that they follow the output of the stress source, and their outputs can be switched so that the monitor source makes connection with the DUT.

Figure 1:
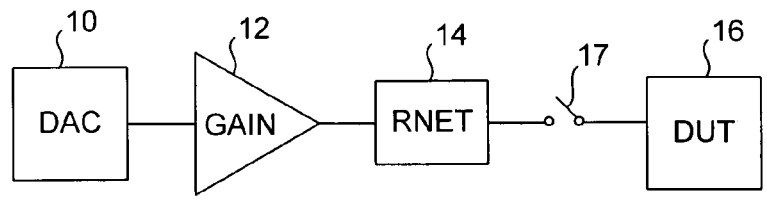
FIG. 1 is a functional block diagram of a single output SMU in accordance with prior art.
Figure 2:
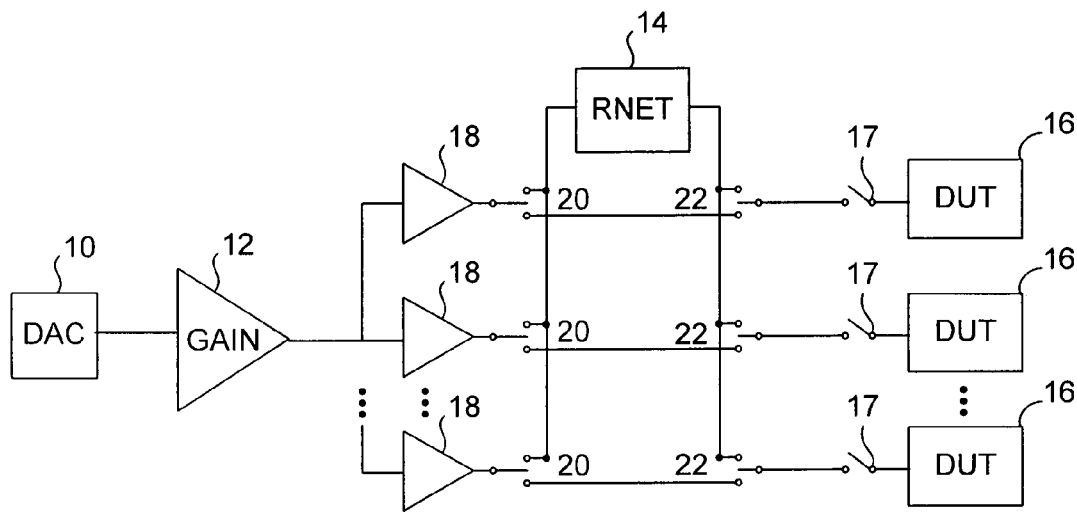
FIG. 2 is a function block diagram of a single channel multiple output SMU in accordance with prior art.
Figure 3:
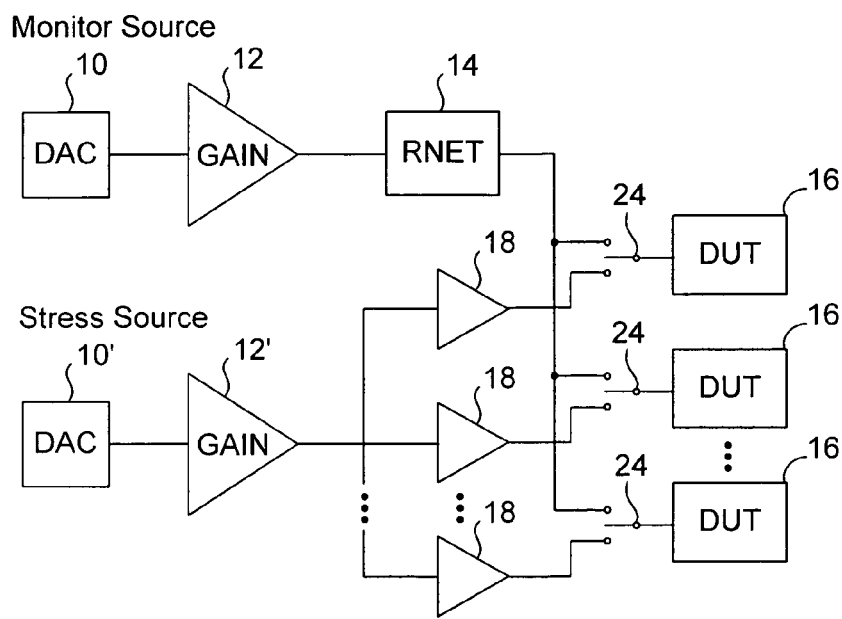
FIG. 3 is a functional block diagram of a dual channel multiple output SMU in accordance with an embodiment of the invention.

FIG. 3 is a functional block diagram of a dual channel SMU in accordance with an embodiment of the invention which decouples the stress and monitor portions of the SMU so that the requirements of each be optimized. The monitor source includes DAC 10 and gain amplifier 12 which are serially connected with RNET 14 and selectively through toggle switches 24 to one of the DUTs 16. The stress source includes DAC 10' and gain amplifier 12' can be serially connected through buffers 18 to one or more of the DUT 16 through toggle switches 24.

A major change in the dual channel multiple output SMU is the addition of a second programmable voltage source and the transfer of the RNET from the buffered sources to one of the programmable voltage sources, referred to as the "monitor" source. The other programmable voltage source is connected to voltage followers or buffers, which are referred to as "stress" sources.

At any time, a DUT can be connected to either the monitor source or a stress source. This allows more flexible testing to be performed on the DUTs while still maintaining high capacity tests. For example, a common test might require multiple DUTs to be stressed for a set time interval (stress phase) followed by a set of measurements on these same DUTs (monitor phase) in order to meet these requirements, the dual channel multiple output SMU is configured so that all DUTs are connected to stress sources during the stress phase. Then, during the monitor phase, the monitor source is connected to each DUT sequentially and the necessary measurements are made for each DUT while the other connected DUTs remain in their stressed condition. In this configuration, the time required for the monitor phase of each DUT is limited to the time it takes to measure the single DUT, while with the single channel multiple output SMU, it would take n times the single DUT measurement time where n is the number of DUTs being tested. This minimizing of the monitor phase time is important in testing DUTs where the undesirable effects of relaxation or recovery occur whenever the DUT is removed from its stress stimulus.

The decoupling of the monitor and stress circuitry also provides the capability of adjusting the sources to have different output power restrictions. The most practical application of this characteristic would be a test with the monitor power requirements were significantly greater than the stress power requirements. Since the power handling of the source is generally directly proportional to its required physical space, is much simpler to provide a single high power monitor source than to increase the power of all sources, which would be required in the single channel multiple output SMU if the same monitor power capability were required.

Additionally, the separation of the stress and monitor circuitry removes the need for low leakage buffers since the stress sources, where the buffers are used, are not connected when a current measurement is performed, and therefore have no impact on the minimum current measurement threshold. By not being limited to this requirement, other characteristics can be optimized. Further, low voltage offset buffers can be used which can increase voltage accuracy of the stress source outputs significantly. Additionally, more common parts can be utilized for the buffers which help alleviate cost and availability problems.

In order to facilitate a clean transition between the buffered voltage sources at the stress voltage level and the monitor source, deglitcher circuitry can be placed between the monitor source and a toggle switch 24 and between the stress sources and toggle switches 24. A deglitcher circuit acts as a timed switch in connecting or disconnecting at a specified rate so that the sources can react to the switching without causing a glitch.

Figure 4:
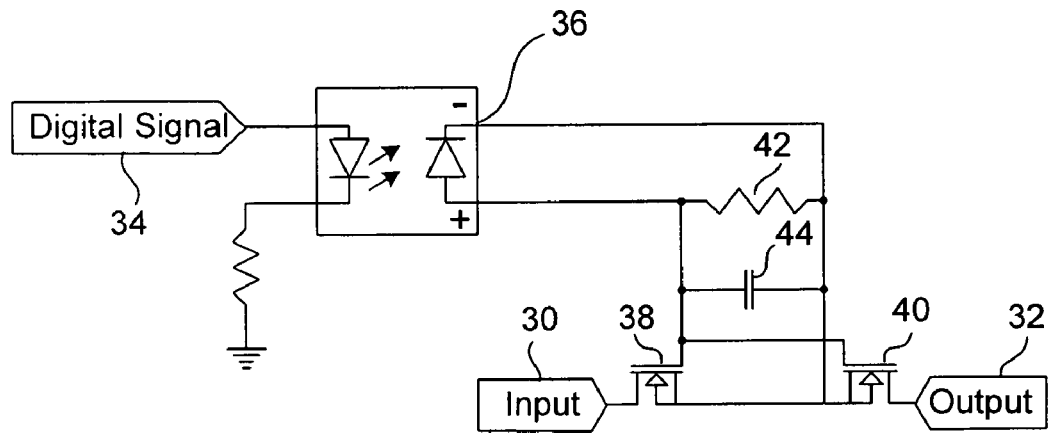
FIG. 4 is a schematic of a deglitcher timed switch circuit useful in the SMU of FIG. 3.
Figure 5:
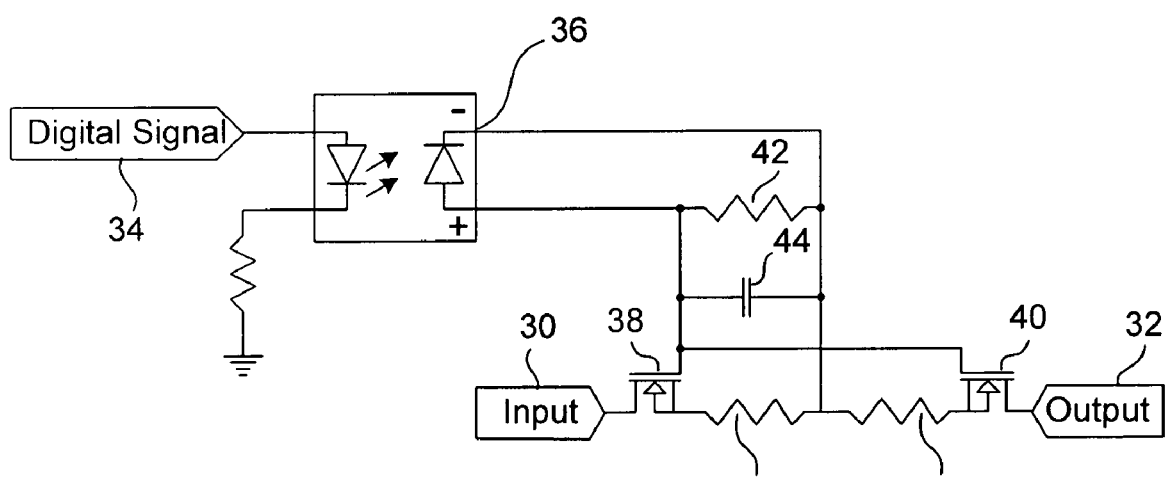
FIG. 5 is a schematic of the deglitcher timed switch circuit of FIG. 4 as modified to clamp current.

FIGS. 4 and 5 are schematics of deglitcher timed switch circuits which can be used with the dual channel SMU of the invention. In FIG. 4 a monitor or stress voltage source is connected to input 30 and a toggle switch is connected to output 32, thereby connecting the deglitcher serially between the voltage source and the toggle switch. A digital signal at 34 activates or deactivates the deglitcher circuit whereby if the digital signal is high, a current will flow through the photovoltaic isolator (PVI) 36 which creates an isolated voltage potential across its output. This voltage potential biases two MOSFET transistors 38 and 40 to switch on and allow current to flow in either direction through the transistors. The switch timing is determined by a resistor 42 and capacitor 44 in parallel with the gates and drains of the transistors. When the digital signal transitions to a low level, PVI 36 will no longer provide a biasing voltage and the charge stored in capacitor 44 will dissipate into the resistor 42, causing the transistors to turn off at a rate determined by the resistor and capacitor value. Once the capacitor is completely discharged, the transistors will be switched off and current will no longer flow through them.

FIG. 5 is a modified version of the deglitcher circuit of FIG. 4 which includes the ability to clamp current to a specified level when the deglitcher circuit is activated. Like components in FIGS. 4 and 5 have the same reference numerals. Here, two resistors 46, 48 are connected in series between the source pins of the two transistors with the negative terminal of PVI 36 connected to the common node of the two resistors. Assuming the digital signal is high (i.e. the deglitcher is activated) the two resistors will develop a voltage across them when current flows through the transistors. As this voltage increases, it will decrease the biasing of one of the transistors depending on the direction of current flow. Eventually, when a certain threshold is reached, the transistor will restrict the flow of current and clamping will occur. The threshold is determined by the value of the resistors 46, 48. The current clamp is necessary to provide protection to other portions of the circuitry in the event of an overcurrent situation.

A dual channel source measurement unit in accordance with the invention achieves a number of advantages over a single channel unit by decoupling the stress and monitor portions of the SMU so that the requirements of each can be optimized.

While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A dual channel source measurement unit for testing a plurality of electrical devices comprising:
    a monitor source unit for providing a programmable monitor voltage and including means for measuring current through the monitor source unit when connected to an electrical device under test,
    a stress source unit for providing a programmable stress voltage and including a plurality of buffers,
    a plurality of switches connected to the plurality of buffers for selectively switching a plurality of electrical devices under test in parallel to the stress source unit and switching serially a device under test to the monitor source unit, whereby the plurality of devices under test are stressed while test measurements are made on another device under test, the plurality of switches comprising a plurality of toggle switches and a plurality of deglitcher switches where each deglitcher switch is serially connected with a toggle switch and includes two serially connected transistors and conduction biasing circuitry for turning on the transistors.

2. The dual channel source measurement unit as defined by claim 1 wherein the conduction biasing circuitry includes a resistor-capacitor network for effecting a conduction time period for the transistors.

3. The dual channel source measurement unit as defined by claim 2 wherein the conduction biasing circuitry includes two resistors serially connecting the two transistors with voltage at a common terminal of the two resistors coupled to the resistor-capacitor network to limit bias on one of the two transistors and clamp current through the two transistors.

4. The dual channel source measurement unit as defined by claim 1 wherein the conduction biasing circuitry is controlled by a digital signal applied through a photovoltaic isolator to the conduction biasing circuitry.

5. A dual channel source measurement unit for testing electrical devices comprising:
- a monitor source unit for providing a programmable monitor voltage,
- a stress source unit for providing a programmable stress voltage,
- a plurality of switches for selectively switching a plurality of electrical devices under test in parallel to the stress source unit and switching serially a single device under test to the monitor source unit, whereby the plurality of devices under test are stressed while test measurements are made on the single device under test, and wherein the plurality of switches comprise a plurality of deglitcher switches whereby each deglitcher switch is coupled one of the devices under test and includes two serially connected transistors and conduction biasing circuitry for turning on the transistors.

6. The dual channel source measurement unit as defined by claim 5 wherein the conduction biasing circuitry includes a resistor-capacitor network for effecting a conduction time period for the transistors.

7. The dual channel source measurement unit as defined by claim 6 wherein the conduction biasing circuitry includes two resistors serially connecting the two transistors with voltage at a common terminal of the two resistors coupled to the resistor-capacitor network to limit bias on one of the two transistors and clamp current through the two transistors.

8. The dual channel source measurement unit as defined by claim 5 wherein the conduction biasing circuitry is controlled by a digital signal applied through a photovoltaic isolator to the conduction biasing circuitry.

* * * * *